United States Patent
Matsumiya

(10) Patent No.: US 11,323,636 B2
(45) Date of Patent: May 3, 2022

(54) CONTROL CIRCUIT FOR INFRARED DETECTORS, IMAGING DEVICE, AND CONTROL METHOD FOR INFRARED DETECTORS

(71) Applicant: FUJITSU LIMITED, Kawasaki (JP)

(72) Inventor: Yasuo Matsumiya, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 199 days.

(21) Appl. No.: 16/658,588

(22) Filed: Oct. 21, 2019

(65) Prior Publication Data

US 2020/0154062 A1 May 14, 2020

(30) Foreign Application Priority Data

Nov. 13, 2018 (JP) .............................. JP2018-213210

(51) Int. Cl.
*H04N 5/33* (2006.01)
*H04N 5/374* (2011.01)
*H01L 27/146* (2006.01)

(52) U.S. Cl.
CPC ......... *H04N 5/33* (2013.01); *H01L 27/14669* (2013.01); *H04N 5/3741* (2013.01)

(58) Field of Classification Search
CPC .. H04N 5/33; H04N 5/3741; H01L 27/14669; H01L 27/1467
See application file for complete search history.

(56) References Cited

U.S. PATENT DOCUMENTS

| | | | | |
|---|---|---|---|---|
| 2005/0096111 A1* | 5/2005 | Beck | ...................... | A63H 33/22 463/7 |
| 2008/0079817 A1* | 4/2008 | Murata | ............ | H04N 5/232939 348/222.1 |
| 2008/0089552 A1* | 4/2008 | Nakamura | ........... | H04N 21/835 382/100 |
| 2017/0255332 A1* | 9/2017 | Ueno | .................... | G06F 1/1626 |

FOREIGN PATENT DOCUMENTS

| | | |
|---|---|---|
| JP | 1-288086 A | 11/1989 |
| JP | 11-205683 A | 7/1999 |
| JP | 11205683 A * | 7/1999 |

* cited by examiner

*Primary Examiner* — Yogesh K Aggarwal
(74) *Attorney, Agent, or Firm* — Fujitsu Patent Center

(57) ABSTRACT

A control circuit for infrared detectors, includes: a driving circuit configured to drive a plurality of infrared detectors and generates, for each frame, a signal according to infrared rays incident on the plurality of infrared detectors; a holding circuit configured to hold a first signal generated by the driving circuit in a first frame and a second signal generated by the driving circuit in a second frame before the first frame; a difference calculation circuit configured to calculate a difference between the first signal and the second signal; and an amplifier circuit configured to amplify and output the difference calculated by the difference calculation circuit.

11 Claims, 13 Drawing Sheets

CONTROL CIRCUIT FOR INFRARED DETECTORS, IMAGING DEVICE, AND CONTROL METHOD FOR INFRARED DETECTORS

CROSS-REFERENCE TO RELATED APPLICATION

This application is based upon and claims the benefit of priority of the prior Japanese Patent Application No. 2018-213210, filed on Nov. 13, 2018, the entire contents of which are incorporated herein by reference.

FIELD

The embodiments discussed herein are related to a control circuit for infrared detectors, an imaging device, and a control method for the infrared detectors.

BACKGROUND

In the related art, there is known an infrared solid-state imaging apparatus including a signal comparison circuit which compares an electric signal output from a pixel in a current frame with an electric signal output from the pixel in a previous frame and outputs a signal (a binary signal representing a change in a moving body) representing a comparison result. In the infrared solid-state imaging apparatus, the binary signal output from the signal comparison circuit is transmitted to a horizontal reading line and then is output from an output terminal.

Japanese Laid-open Patent Publication No. 11-205683 is an example of related art.

SUMMARY

According to an aspect of the embodiments, a control circuit for infrared detectors, includes: a driving circuit configured to drive a plurality of infrared detectors and generates, for each frame, a signal according to infrared rays incident on the plurality of infrared detectors; a holding circuit configured to hold a first signal generated by the driving circuit in a first frame and a second signal generated by the driving circuit in a second frame before the first frame; a difference calculation circuit configured to calculate a difference between the first signal and the second signal; and an amplifier circuit configured to amplify and output the difference calculated by the difference calculation circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
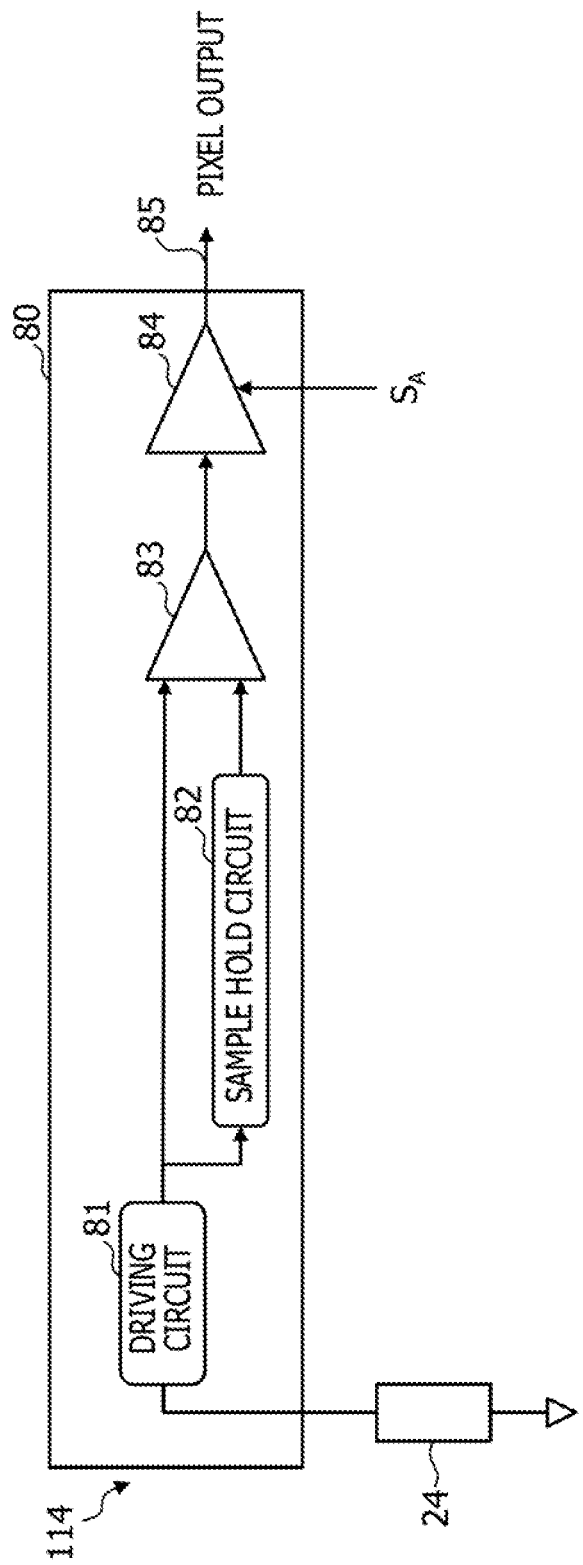
FIG. 1 is a diagram illustrating an example of a configuration of an imaging device.

Meanwhile, in the related art, since a signal as it is representing a result obtained by comparing an electric signal output from a pixel in a current frame with an electric signal output from the pixel in a previous frame is output from an output terminal to the outside, noise resistance may be reduced.

The present disclosure provides a control circuit for infrared detectors, an imaging device, and a control method for the infrared detectors with improved noise resistance.

Hereinafter, embodiments according to the present disclosure are described.

Since an image sensor which detects thermal infrared rays emitted in response to heat of an object may require no lighting, the image sensor has an advantage in detecting a heat source from a long distance, and is effective for detecting victims over the sea, a snow mountain, or the like. For example, a cooled sensor using mercury cadmium telluride (HgCdTe) (MCT), a quantum well infrared photodetector (QWIP), or the like has higher sensitivity and temperature resolution than an uncooled sensor such as a microbolometer or the like. For this reason, the cooled sensor is very effective in a case of searching a wide area in a short time or the like.

Meanwhile, since the cooled sensor tends to be large in scale and expensive as compared with the uncooled sensor, the cooled sensor may not be sufficiently popular. There is a problem specific to the cooled sensor, for one of the causes. In the cooled sensor, a sensor main body is installed in a vacuum vessel so as to cool a photoelectric conversion unit such as MCT, QWIP, or the like, and a signal output from the sensor main body is read by a sensor driving circuit installed outside the vacuum vessel. For this reason, in some cases, a signal path between the photoelectric conversion unit and the sensor driving circuit is long, and resistance to noise is relatively weak. When a cooler or the like for element cooling, which is a noise source, is disposed in the vicinity of the sensor, a signal to noise (SN) ratio may be degraded as compared with the single photoelectric conversion unit.

In the technology of the present disclosure, noise countermeasures are performed focusing on characteristics of a use scene of the cooled sensor. In an application field of heat source detection by an infrared imaging apparatus such as a search for victims over the sea or in a snowy mountain, detection of distant aircraft in the sky, or the like, a bright spot from a target is detected from background light of approximately uniform brightness. The infrared imaging apparatus includes a data processing system which records an output signal for each frame from an imaging device which compares the amount of light received by an infrared detector, and the data processing system calculates a difference of the output signals between frames to detect a target. In this case, in the data processing system at a subsequent stage of the imaging device, it is required to consistently record a full-scale output of the imaging device. Meanwhile, since information actually focusing on target detection is a minute signal difference between frames, it is required to take measures against noise which intrudes into a signal path from the imaging device to the data processing system at the subsequent stage.

FIG. 1 is a diagram illustrating an example of a configuration of an imaging device according to the technology of the present disclosure. An imaging device 114 illustrated in FIG. 1 includes an infrared detector 24 which detects infrared rays emitted from an object to be observed in accordance with a surface temperature of the object to be observed and a control circuit 80 which controls the infrared detector 24. The imaging device 114 is also referred to as an infrared ray image sensor.

The infrared detector 24 is a photoconductive element having a characteristic in which a resistance value changes in accordance with an incident amount of infrared rays. The infrared detector 24 is a light receiving element which generates a photocurrent according to the incident amount of infrared rays incident on the infrared detector 24. For example, the infrared detector 24 is a photoelectric conversion unit which converts an intensity of infrared rays into an electric signal.

By controlling the infrared detector 24, the control circuit 80 generates a sensor output signal (a pixel output signal) for generating a thermal image (a thermographic image) indicating surface temperature distribution of the object to be observed. The imaging device 114 outputs the analog sensor output signal (the pixel output signal) generated by the control circuit 80.

The control circuit 80 includes a driving circuit 81, a holding circuit 82, a difference calculation circuit 83, and an amplifier circuit 84.

The driving circuit 81 drives a plurality of infrared detectors 24 and generates, for each frame, a signal according to infrared rays incident on the plurality of infrared detectors 24.

The holding circuit 82 includes a first signal generated by the driving circuit 81 in a first frame, and a second signal generated by the driving circuit 81 in a second frame before the first frame. The first signal corresponds to a signal according to infrared rays incident on the plurality of infrared detectors 24 in the first frame, and the second signal corresponds to a signal according to infrared rays incident on the plurality of infrared detectors 24 in the second frame. The holding circuit 82 is, for example, a sample hold circuit. The second frame may be a frame one frame before the first frame, or a frame two or more frames before the first frame.

The difference calculation circuit 83 calculates a difference of the first signal and the second signal. The difference calculation circuit 83 is, for example, a difference amplifier which outputs a signal corresponding to the difference.

The amplifier circuit 84 amplifies and outputs the difference calculated by the difference calculation circuit 83. The amplifier circuit 84 is, for example, an output amplifier which amplifies the difference and outputs an amplified signal. The signal (the output signal of the amplifier circuit 84) output from the amplifier circuit 84 corresponds to an analog sensor output signal (a pixel output signal) output from the control circuit 80. The pixel output signal is supplied to a sensor driving circuit 159 (see FIG. 3 and details will be described below) outside the imaging device 114 via a wiring 85. The sensor driving circuit 159 drives the imaging device 114 so as to obtain an analog pixel output signal output from the imaging device 114.

Therefore, with the configuration illustrated in FIG. 1, a signal obtained by amplifying a difference between the first signal generated in the current first frame and the second signal generated in the past second frame is transmitted to the wiring 85 coupling between the imaging device 114 in a vacuum vessel and the external sensor driving circuit 159. Therefore, even when noise intrudes into the wiring 85, noise resistance is improved as compared with a configuration in which a minute signal is output as it is without amplifying the difference. As a result, for example, since noise resistance may be secured without using an expensive electromagnetic shielding material for the wiring 85 or without using an expensive cooler with little electromagnetic noise, miniaturization and cost reduction of the imaging device 114 may be achieved. According to miniaturization and cost reduction of the imaging device 114, miniaturization and cost reduction of an infrared imaging apparatus on which the imaging device 114 is mounted may be achieved. When using an electromagnetic shielding material for the wiring 85 or when using a cooler with little electromagnetic noise, noise resistance of the infrared imaging apparatus on which the imaging device 114 is mounted is further improved.

Next, a configuration example of an imaging device in the technology of the present disclosure and an infrared imaging apparatus including the imaging device will be described in more detail.

Figure 2:
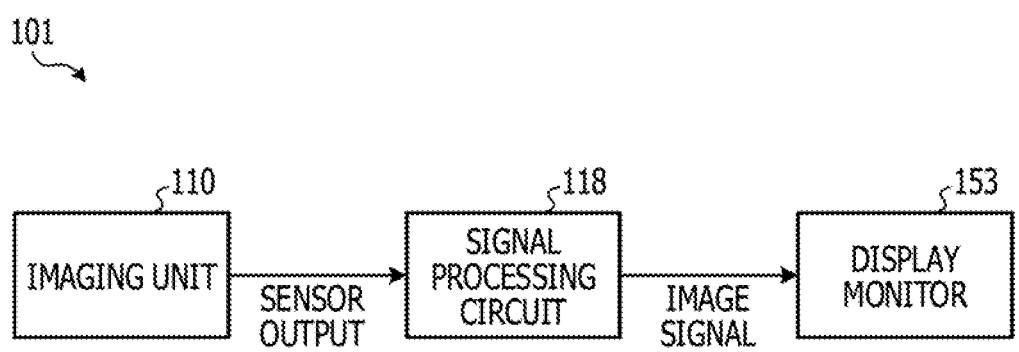
FIG. 2 is a diagram illustrating an example of a configuration of an infrared imaging apparatus.

FIG. 2 is a diagram illustrating an example of a configuration of the infrared imaging apparatus according to the technology of the present disclosure. An infrared imaging apparatus 101 illustrated in FIG. 2 includes the imaging unit 110, a signal processing circuit 118, and a display monitor 153. The display monitor 153 may be included in or may not be included in a configuration of the infrared imaging apparatus 101.

The imaging unit 110 includes the imaging device 114 described above. The imaging unit 110 converts an analog sensor output signal (a pixel output signal) output from the imaging device 114 into a digital sensor output signal (a pixel output signal), and outputs the digital sensor output signal. The signal processing circuit 118 generates an image signal for generating a thermal image to be displayed on the display monitor 153, based on the digital sensor output signal from the imaging unit 110. The display monitor 153 displays the thermal image, based on the image signal output from the signal processing circuit 118.

Figure 3:
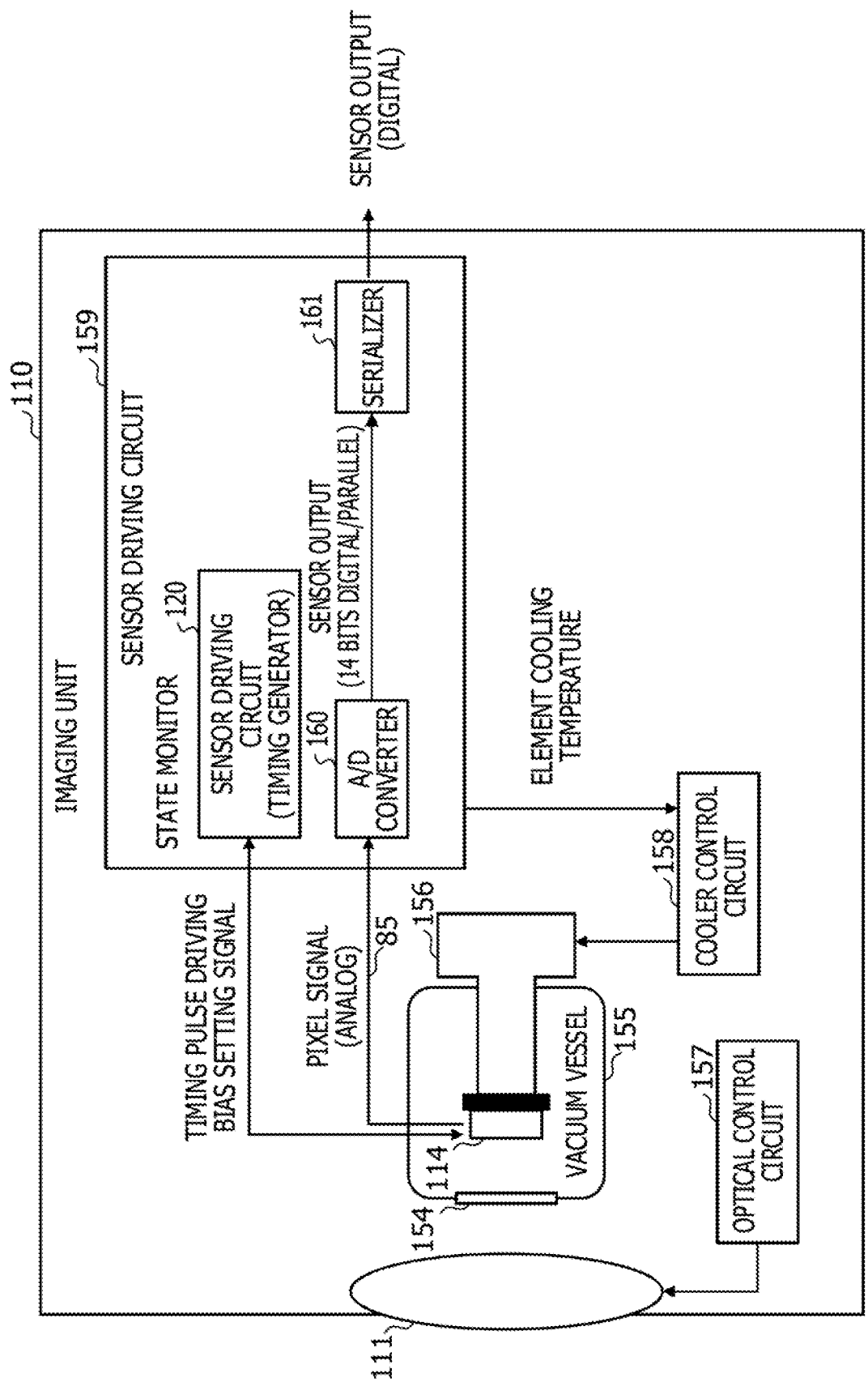
FIG. 3 is a diagram illustrating an example of a configuration of an imaging unit including the imaging device.

FIG. 3 is a diagram illustrating an example of a configuration of the imaging unit 110 including the imaging device 114. The imaging device 114 is an infrared ray image sensor having a light receiving element array chip flip-chip coupled over a chip over which the control circuit 80 is formed. The light receiving element array chip is a sensor array in which the infrared detectors 24 such as quantum well infrared photodetectors (QWIPs) are arranged in a one-dimensional or two-dimensional array.

The imaging device 114 is enclosed in a vacuum vessel 155. A cooler 156 cools the imaging device 114 to 70 to 80K. An incident window 154 for infrared rays is attached to a tip of the vacuum vessel 155. Infrared rays imaged by an optical system including a lens 111 disposed in front of the vacuum vessel 155 are incident on the imaging device 114 through an incident window 154. A position of a focal point at which the lens 111 forms an image is adjusted to an incident surface of the imaging device 114.

The imaging unit 110 includes a cooler control circuit 158 for keeping a cooling temperature of the imaging device 114 stable, and an optical control circuit 157 for adjusting a focus of the lens 111.

The imaging unit 110 includes the sensor driving circuit 159 for driving the imaging device 114. The sensor driving circuit 159 includes a timing generator 120 which supplies a timing pulse signal (for example, a clock signal, a frame synchronization signal, a shift register control signal, or the like) to the control circuit 80 described above in the imaging device 114. The driving circuit 81 and the holding circuit 82 described above in the control circuit 80 operate according to the timing pulse signal supplied from the timing generator 120. The sensor driving circuit 159 supplies an operation power supply of the control circuit 80, a power supply voltage of an amplifier in the control circuit 80, a reset voltage, and a bias voltage such as a gate driving signal or the like to the control circuit 80 in the imaging device 114.

The sensor driving circuit 159 includes an analog-to-digital (A/D) converter 160. The A/D converter 160 converts an analog pixel output signal input from the control circuit 80 in the imaging device 114 via the wiring 85 into, for example, a parallel digital output of 14 bits. The 14 parallel digital outputs are converted into one series of time-series digital signals by a serializer 161, and the converted digital signals are output to the outside as sensor output signals (pixel output signals).

FIG. 3 illustrates a configuration of the A/D converter 160 and the subsequent stage of the A/D converter 160 with one output system. Meanwhile, in a case where pixels of a two-dimensional array are divided into a plurality of areas and read out, the number of output channels from the control circuit 80 is plural, so that the number of A/D converters may be increased according to the number of channels.

Figure 4:
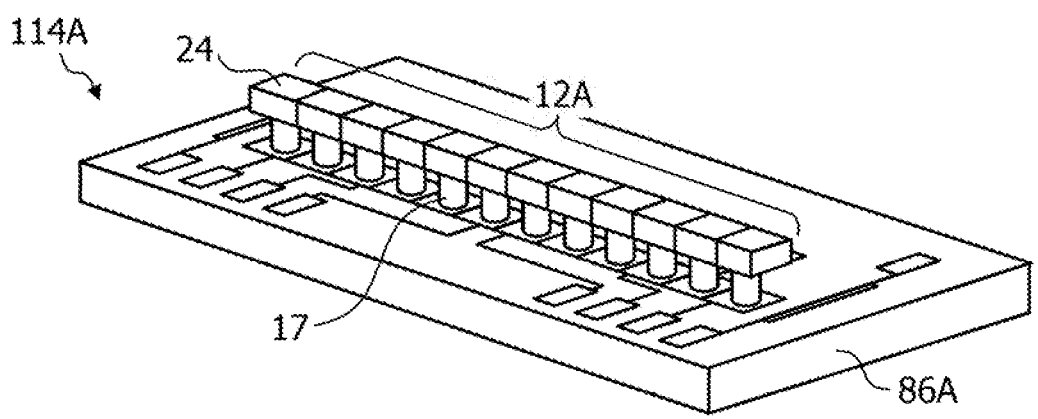
FIG. 4 is a diagram illustrating an example of a configuration of an imaging device according to a first embodiment.

FIG. 4 is a diagram illustrating an example of a configuration of an imaging device according to a first embodiment. An imaging device 114A illustrated in FIG. 4 is an example of the imaging device 114 described above. The imaging device 114A includes a one-dimensional sensor array 12A in which a plurality of infrared detectors 24 are arranged in one-dimensional direction. The imaging device 114A includes a circuit substrate 86A on which the control circuit 80 which reads an electric signal obtained in the one-dimensional sensor array 12A is formed. The one-dimensional sensor array 12A and the control circuit 80 are coupled by a plurality of bumps 17 made of, for example, indium.

Figure 5:
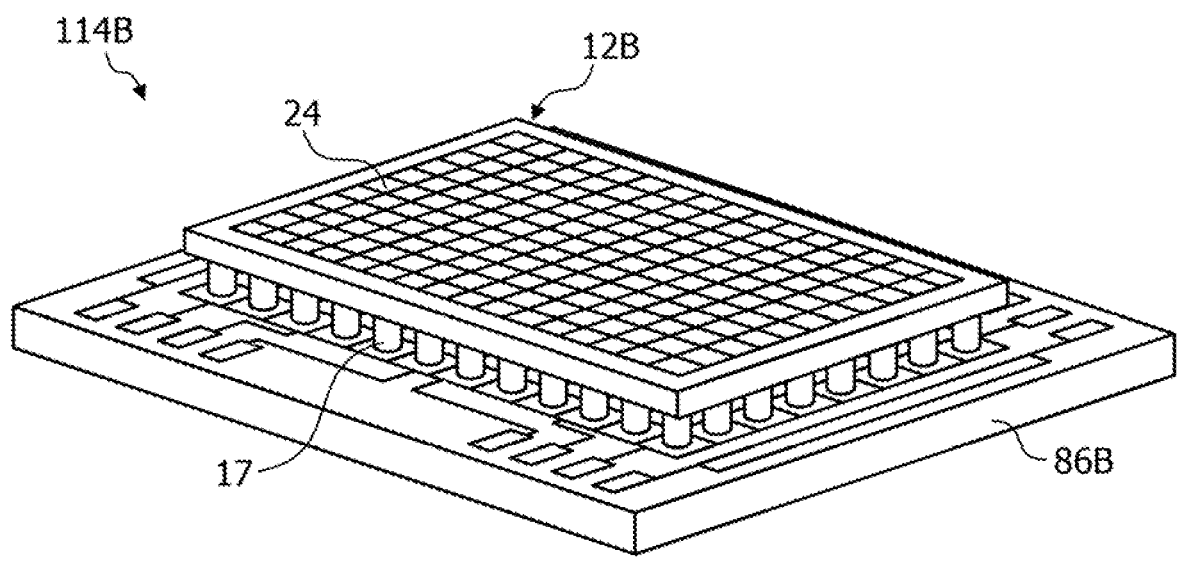
FIG. 5 is a diagram illustrating an example of a configuration of an imaging device according to a second embodiment.

FIG. 5 is a diagram illustrating an example of a configuration of an imaging device according to a second embodiment. An imaging device 114B illustrated in FIG. 5 is an example of the imaging device 114 described above. The imaging device 114B includes a two-dimensional sensor array 12B in which a plurality of infrared detectors 24 are arranged in two-dimensional direction. The imaging device 114B includes a circuit substrate 86B on which the control circuit 80 which reads an electric signal obtained in the two-dimensional sensor array 12B is formed. The two-dimensional sensor array 12B and the control circuit 80 are coupled by a plurality of bumps 17 made of, for example, indium.

Figure 6:
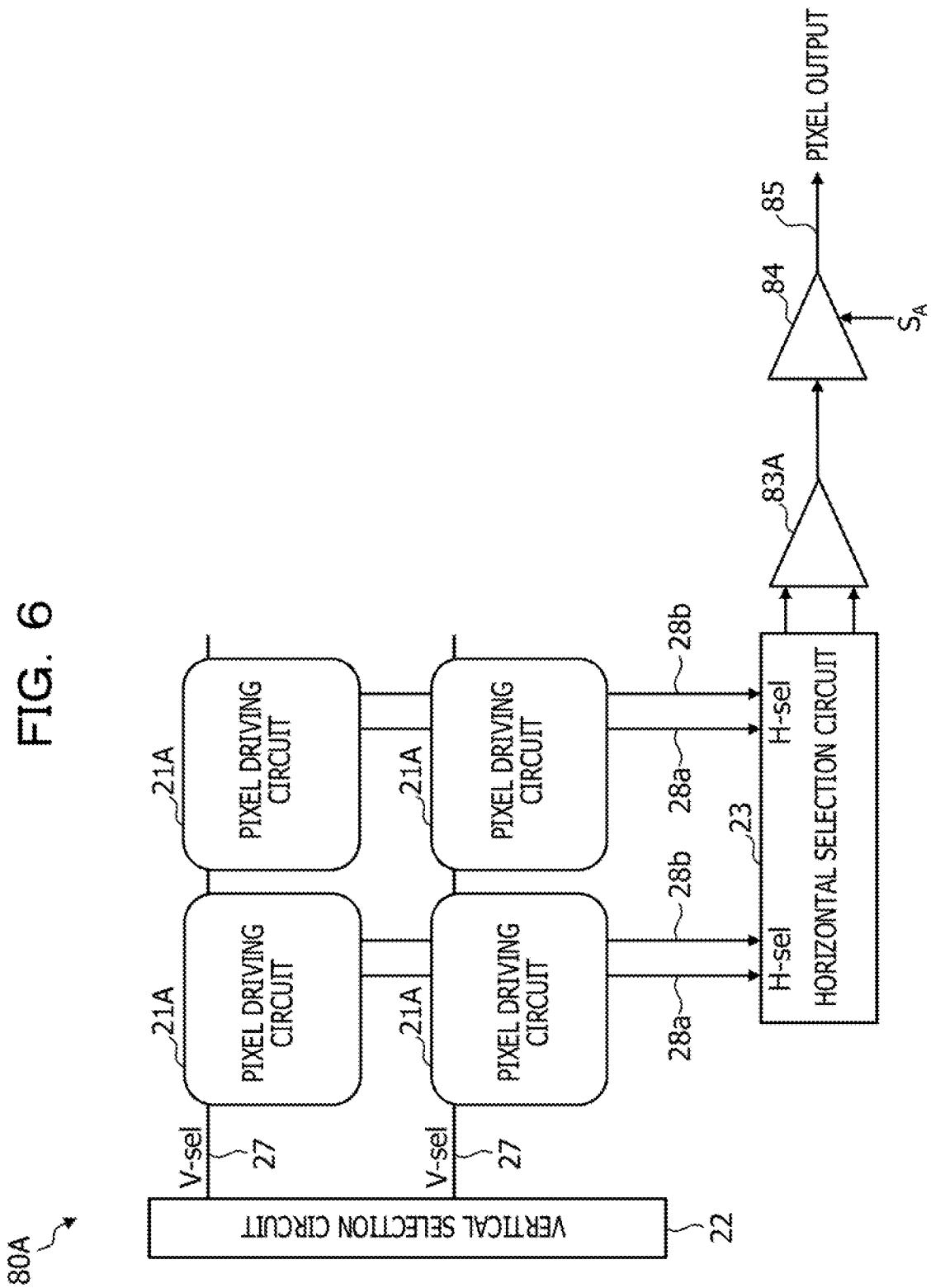
FIG. 6 is a diagram illustrating a first configuration example of a control circuit included in the imaging device according to the second embodiment.

FIG. 6 is a diagram illustrating a first configuration example of a control circuit included in the imaging device 114B according to the second embodiment. A control circuit 80A illustrated in FIG. 6 is an example of the control circuit 80 including the driving circuit 81 and the like described above. The driving circuit 81 in the control circuit 80A drives a corresponding infrared detector among the plurality of infrared detectors 24, and includes a plurality of pixel driving circuits 21A which generate, for each frame, a signal according to infrared rays incident on the corresponding infrared detector.

The control circuit 80A includes a plurality of scan lines 27 extending in parallel in a horizontal direction (a row direction), a plurality of vertical bus lines 28 (28a and 28b) extending in parallel in a vertical direction (a column direction), a vertical selection circuit 22, and a horizontal selection circuit 23.

The pixel driving circuits 21A are arranged in a matrix shape corresponding to respective intersections of the plurality of scan lines 27 and the plurality of vertical bus lines 28. The pixel driving circuit 21A is provided for a corresponding one of the plurality of infrared detectors 24. The plurality of pixel driving circuits 21A have configurations which are identical to one another.

Figure 7:
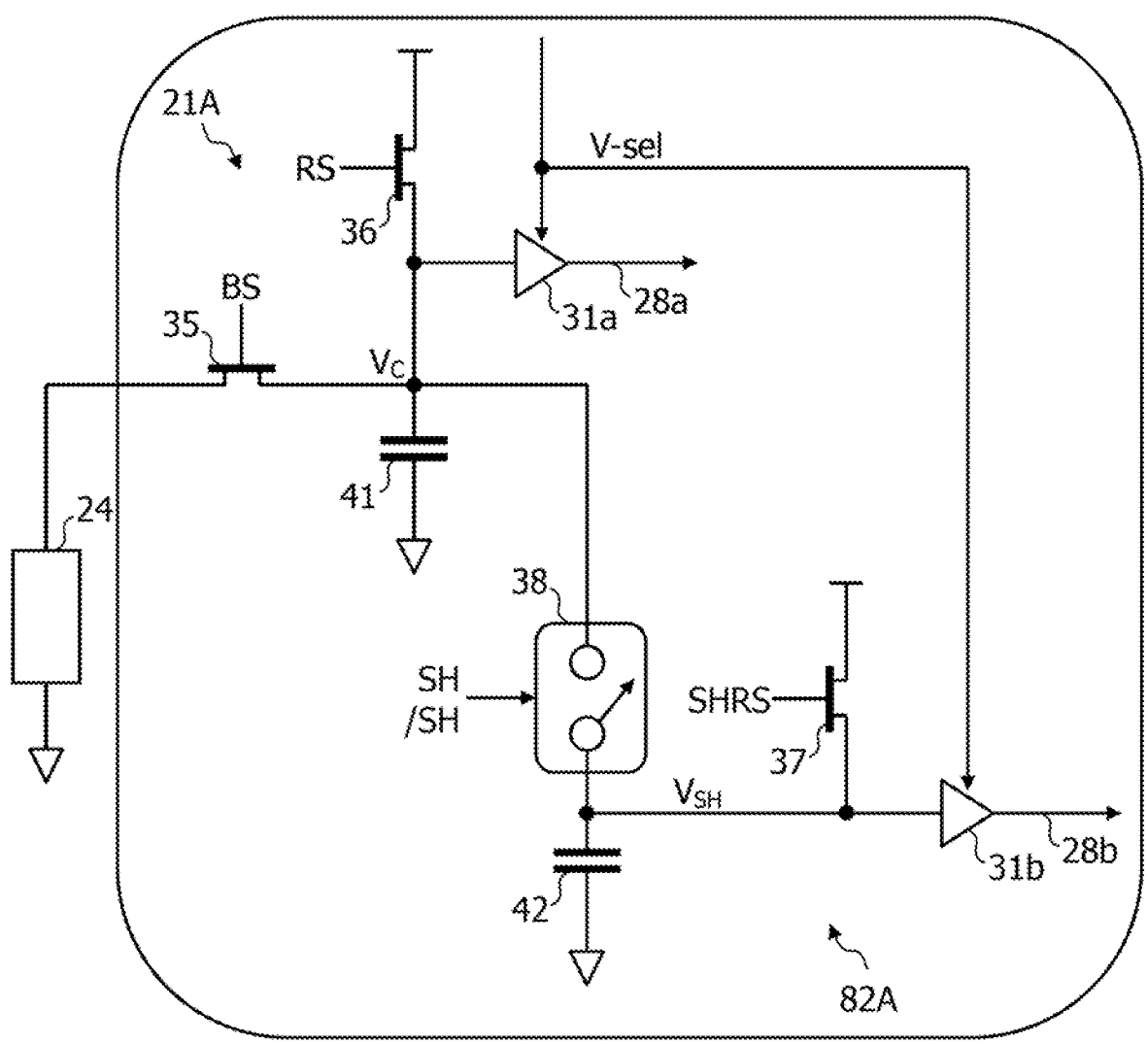
FIG. 7 is a diagram illustrating an example of a configuration of a pixel driving circuit and a holding circuit included in the control circuit according to the first configuration example.

FIG. 7 is a diagram illustrating an example of a configuration of the pixel driving circuit 21A and the holding circuit 82A included in the control circuit 80A according to the first configuration example. The pixel driving circuit 21A at least includes a driving transistor 35. The holding circuit 82A in the control circuit 80A includes a transfer gate 38, an integration capacitor 41, a holding capacitor 42, a first reset transistor 36, and a second reset transistor 37, in each of the plurality of pixel driving circuits 21A. The holding circuit 82A in the control circuit 80A includes a first buffer 31a and a second buffer 31b in each of the plurality of pixel driving circuits 21A. The holding circuit 82A is an example of the holding circuit 82 described above.

A source of the driving transistor 35 is coupled to one end of the infrared detector 24. A bias setting signal BS supplied from the sensor driving circuit 159 described above is applied to a gate of the driving transistor 35. The other end of the infrared detector 24 is coupled to the ground (GND). The driving transistor 35 is, for example, an N-channel type metal oxide semiconductor (MOS) transistor.

The driving transistor 35 controls a period for which a current flows through the infrared detector 24 (a period for which an electric charge is discharged from the integration capacitor 41). The bias setting signal BS, which is a gate driving signal, is applied to the gate of the driving transistor 35. For example, the driving transistor 35 is set so as to open and close in accordance with the bias setting signal BS. When the driving transistor 35 is open, a current may flow from the integration capacitor 41 to the infrared detector 24. The bias setting signal BS is supplied from the timing generator 120.

The transfer gate 38 is an analog switch provided between the integration capacitor 41 and the holding capacitor 42. The transfer gate 38 is also referred to as a sample hold switch circuit. One end of the transfer gate 38 is coupled to the other end of the driving transistor 35 and one end of the integration capacitor 41. The other end of the integration capacitor 41 is coupled to the ground. The other end of the transfer gate 38 is coupled to one end of the holding capacitor 42.

Sample hold signals SH and /SH, which are gate driving signals, are applied to gates of the transfer gate 38. The sample hold signal /SH is an inverted signal of the sample hold signal SH. The sample hold signals SH and /SH are supplied from the timing generator 120.

The integration capacitor 41 is provided between the driving transistor 35 and the transfer gate 38. The integration capacitor 41 is an example of a first capacitor which holds a first voltage $V_C$ according to infrared rays incident on the corresponding infrared detector among the plurality of infrared detectors 24 in the first frame. For example, one end of the integration capacitor 41 is coupled to a current path coupling a drain, which is the other end, of the driving transistor 35 and the one end of the transfer gate 38. The other end of the integration capacitor 41 is coupled to the ground. A specific example of the integration capacitor 41 is an electrostatic capacitance element.

The holding capacitor 42 is coupled to the one end of the integration capacitor 41 via the transfer gate 38. The holding capacitor 42 is an example of a second capacitor which holds a second voltage $V_{SH}$ according to infrared rays incident on the corresponding infrared detector among the plurality of infrared detectors 24 in the second frame. The holding capacitor 42 is also referred to as a sample hold capacitor. For example, one end of the holding capacitor 42 is coupled to a current path coupled to the other end of the transfer gate 38. The other end of the holding capacitor 42 is coupled to the ground. A specific example of the holding capacitor 42 is an electrostatic capacitance element.

The first reset transistor 36 is coupled in series between the one end of the integration capacitor 41 and a power supply line. A gate of the first reset transistor 36 is driven by an integration reset signal RS supplied from the timing generator 120.

The second reset transistor 37 is coupled in series between the one end of the holding capacitor 42 and a power supply line. A gate of the second reset transistor 37 is driven by a holding reset signal SHRS supplied from the timing generator 120.

The first buffer 31a outputs the first signal corresponding to the first voltage $V_C$ to the first vertical bus line 28a according to a vertical selection signal V-sel. The vertical selection signal V-sel is an example of a selection signal and is also referred to as a scan pulse. The first buffer 31a is, for example, a transistor which switches the presence and absence of output of the first signal according to the vertical selection signal V-sel. An input unit of the first buffer 31a is coupled between the integration capacitor 41 and the first reset transistor 36.

The second buffer 31b outputs the second signal corresponding to the second voltage $V_{SH}$ to the second vertical bus line 28b according to the vertical selection signal V-sel. The second buffer 31b is, for example, a transistor which switches the presence and absence of output of the second signal according to the vertical selection signal V-sel. An input unit of the second buffer 31b is coupled between the holding capacitor 42 and the second reset transistor 37.

Figure 8:
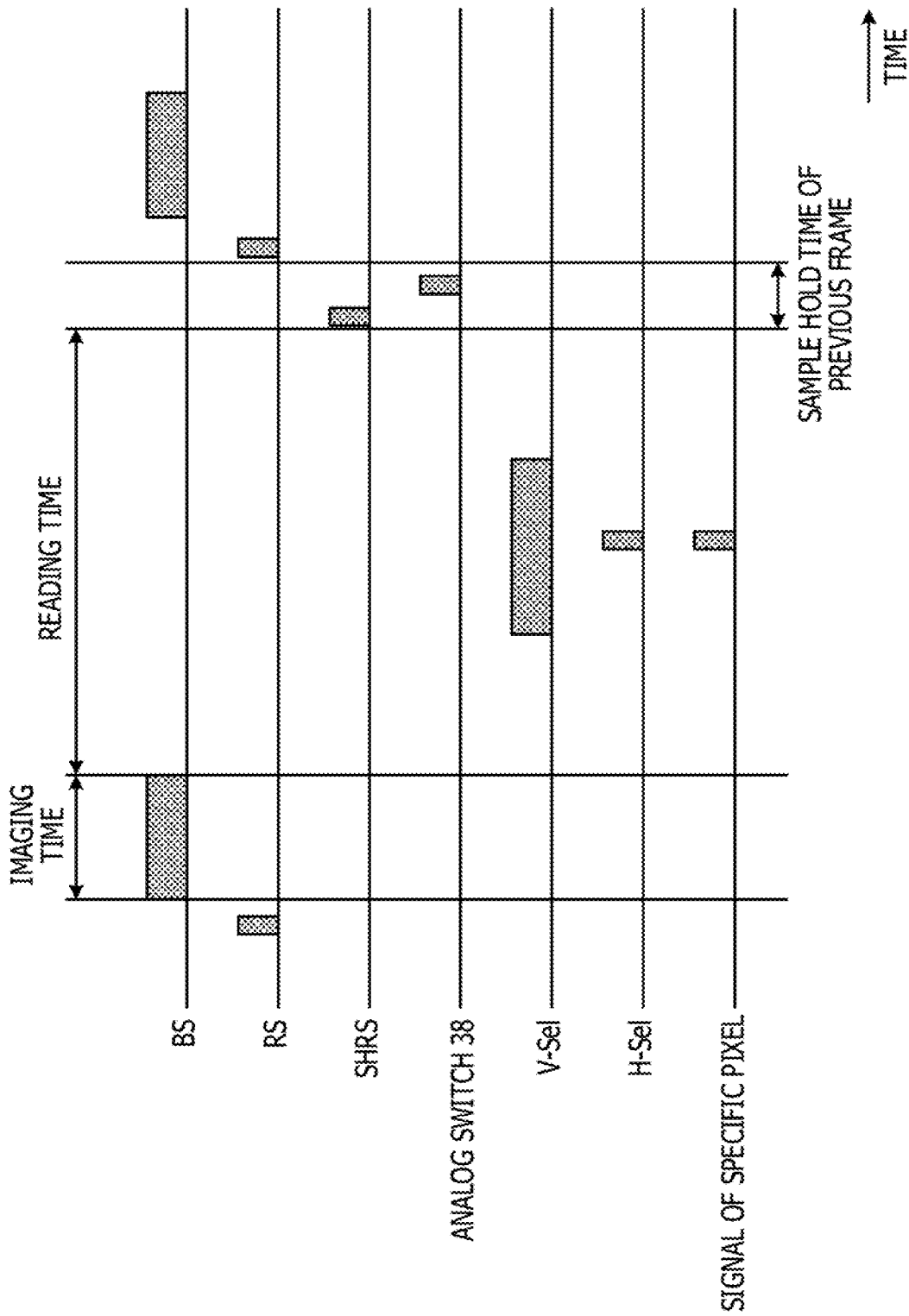
FIG. 8 is a timing chart illustrating an example of a sample hold operation.

FIG. 8 is a timing chart illustrating an example of a sample hold operation performed by a pixel driving circuit. Next, an example of the sample hold operation performed by the pixel driving circuit 21A will be described with reference to FIGS. 6, 7, and 8.

In the pixel driving circuit 21A, the integration reset signal RS is applied to the first reset transistor 36 for gate reset to cause the first reset transistor 36 to conduct and the integration capacitor 41 is charged to a predetermined value. After the application of the integration reset signal RS is stopped, the bias setting signal BS is applied to the driving transistor 35 for gate input for a predetermined period of time to cause a current corresponding to an infrared intensity to flow through the infrared detector 24, and the voltage $V_C$ of the integration capacitor 41 becomes a voltage corresponding to the infrared intensity.

The vertical selection circuit 22 sequentially outputs the vertical selection signal V-sel for selecting the plurality of scan lines 27 one by one. According to the vertical selection signal V-sel, the buffers 31a and 31b, coupled to the scan line 27 to which the vertical selection signal V-sel is output, are selected. The voltage $V_C$ held in the integration capacitor 41 coupled to an input unit of the selected first buffer 31a is output to each of the corresponding first vertical bus lines 28a via the selected first buffer 31a. On the other hand, the voltage $V_{SH}$ held in the holding capacitor 42 coupled to an input unit of the selected second buffer 31b is output to each of the corresponding second vertical bus lines 28b via the selected second buffer 31b.

The horizontal selection circuit 23 sequentially applies a read pulse H-sel. According to the read pulse H-sel, a voltage of the first vertical bus line 28a is input to a first input unit of the difference calculation circuit 83A, and a voltage of the second vertical bus line 28b is input to a second input unit of a difference calculation circuit 83A. The difference calculation circuit 83A is an example of the difference calculation circuit 83 described above.

Accordingly, the first signal generated in the first frame and the second signal generated in the second frame are read by the horizontal selection circuit 23.

After reading the first signal and the second signal, the second reset transistor 37 for the sample hold reset conducts according to the holding reset signal SHRS, and resets a voltage level of the holding capacitor 42 to a predetermined value.

Next, the sample hold signals SH and /SH are applied to the transfer gate 38 which is an analog switch, and the voltage $V_C$ of the integration capacitor 41 is transferred to and held in the holding capacitor 42. The sample hold signal /SH is an inverted signal of the sample hold signal SH. Since these operations are performed respectively and simultaneously by the plurality of pixel driving circuits 21A, the voltage $V_{SH}$ corresponding to the intensity of infrared rays incident on each of the infrared detectors 24 is held in the corresponding holding capacitor 42.

The difference calculation circuit 83A calculates a difference between a voltage input to the first input unit by the horizontal selection circuit 23 and a voltage input to the second input unit by the horizontal selection circuit 23. The difference is an amplification factor set according to a setting signal $S_A$ of an amplification factor, and is output by the amplifier circuit 84.

The amplifier circuit 84 amplifies and outputs the difference calculated by the difference calculation circuit 83A. The amplifier circuit 84 is, for example, an output amplifier which amplifies the difference and outputs an amplified signal. The signal (the output signal of the amplifier circuit 84) output from the amplifier circuit 84 corresponds to an analog sensor output signal (a pixel output signal) output from the control circuit 80A. The pixel output signal is supplied to the sensor driving circuit 159 outside the imaging device 114 via the wiring 85.

When the output of voltages of all the vertical bus lines 28 is completed, the vertical selection circuit 22 applies the vertical selection signal V-sel to the next scan line 27. Thereafter, by repeating the above operation, an analog pixel output signal according to intensities of infrared rays incident on all of the infrared detectors 24 two-dimensionally arranged are output to one output line.

Therefore, according to the control circuit 80A illustrated in FIGS. 6 and 7, a signal obtained by amplifying a difference between the first signal generated in the current first frame and the second signal generated in the past second frame is transmitted to the wiring 85 coupling between the imaging device 114 in a vacuum vessel and the external sensor driving circuit 159. Therefore, even when noise intrudes into the wiring 85, noise resistance is improved as compared with a configuration in which a minute signal is output as it is without amplifying the difference. As a result, for example, since noise resistance may be secured without using an expensive electromagnetic shielding material for the wiring 85 or without using an expensive cooler with little electromagnetic noise, miniaturization and cost reduction of the imaging device 114 may be achieved. According to miniaturization and cost reduction of the imaging device 114, miniaturization and cost reduction of an infrared imaging apparatus on which the imaging device 114 is mounted may be achieved. When using an electromagnetic shielding material for the wiring 85 or when using a cooler with little electromagnetic noise, noise resistance of the infrared imaging apparatus on which the imaging device 114 is mounted is further improved.

In the control circuit 80A illustrated in FIGS. 6 and 7, the plurality of pixel driving circuits 21A share the difference calculation circuit 83A and the amplifier circuit 84. By sharing the difference calculation circuit 83A and the amplifier circuit 84, it is possible to miniaturize the circuit as compared with the case where the difference calculation circuit 83A and the amplifier circuit 84 are not shared.

Next, an example of a method in which the amplifier circuit 84 changes a ratio (an amplification factor) for amplifying the difference between the first signal and the second signal in accordance with the setting signal $S_A$ from the outside will be described.

Figure 9:
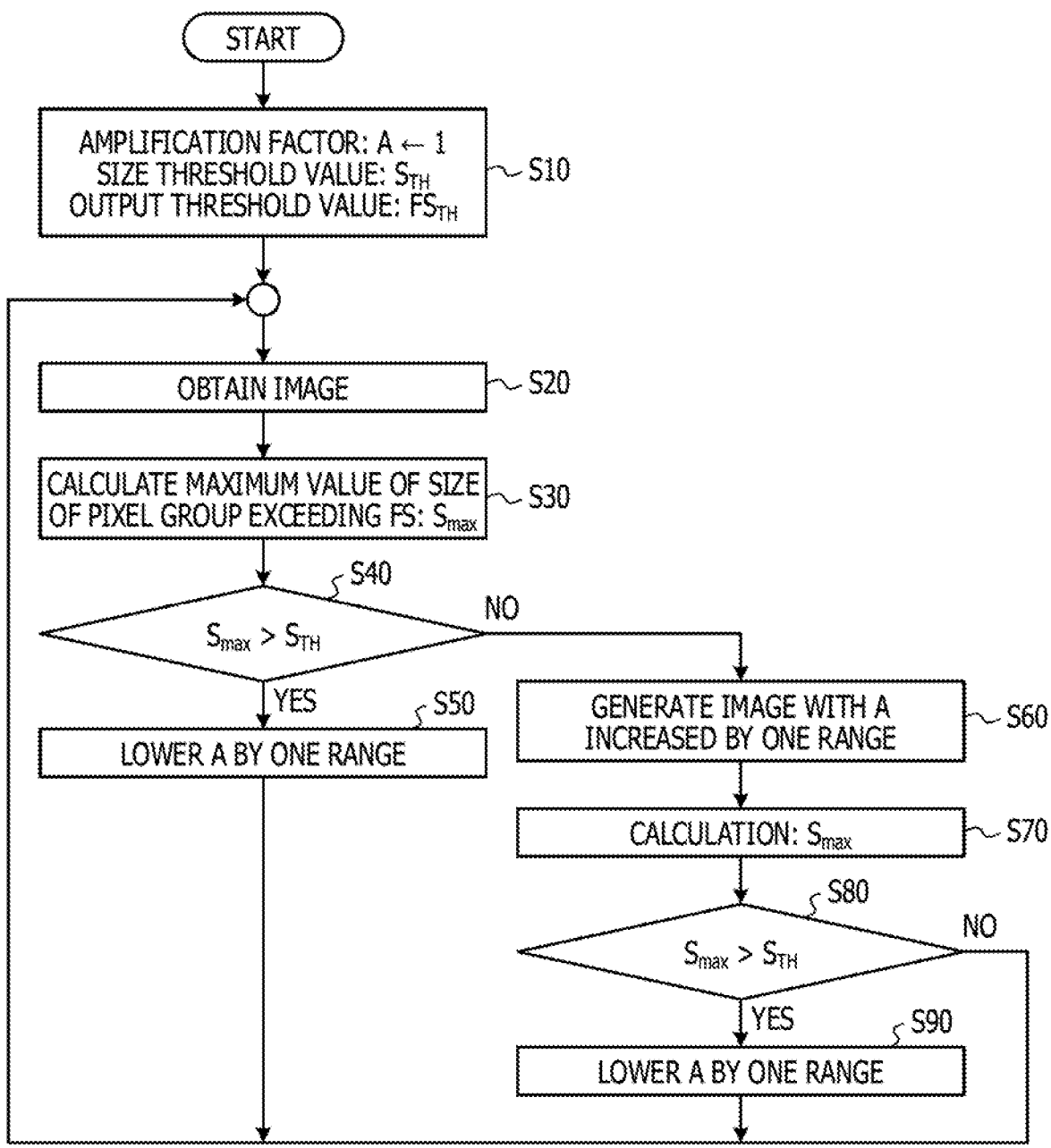
FIG. 9 is a flowchart illustrating a method of adjusting an amplification factor of an output amplifier.

FIG. 9 is a flowchart illustrating a method of adjusting an amplification factor of the amplifier circuit 84 used as an output amplifier.

In step S10, the signal processing circuit 118 sets an amplification factor A of the amplifier circuit 84 to 1 (an initial value). The signal processing circuit 118 sets a size threshold value $S_{TH}$ used for determining whether or not an object is an object to be observed in accordance with an assumed size of the object to be observed. The signal processing circuit 118 sets an output threshold value $FS_{TH}$ to a maximum value (full-scale) of a signal which may be output by the amplifier circuit 84 used as an output amplifier.

In step S20, the signal processing circuit 118 obtains (generates) an image based on a digital sensor output signal output from the imaging unit 110 for all pixels.

In step S30, the signal processing circuit 118 calculates a maximum size $S_{max}$ of the pixel group which exceeds the full-scale (the output threshold value $FS_{TH}$) among all the pixels.

In step S40, the signal processing circuit 118 determines whether or not the maximum size $S_{max}$ calculated in step S30 exceeds the size threshold value $S_{TH}$. In a case where the maximum size $S_{max}$ exceeds the size threshold value $S_{TH}$, the amplification factor A is lowered by one range (step S50). On the other hand, in a case where the maximum size $S_{max}$ is equal to or smaller than the size threshold value $S_{TH}$, the signal processing circuit 118 increases the amplification factor A by one range and obtains (generates) an image with the amplification factor A increased by one range in the same manner as in step S20 (step S60).

In step S70, the signal processing circuit 118 calculates the maximum size $S_{max}$ of the pixel group which exceeds the full-scale (the output threshold value $FS_{TH}$) among all the pixels.

In step S80, the signal processing circuit 118 determines whether or not the maximum size $S_{max}$ calculated in step S70 exceeds the size threshold value $S_{TH}$. In a case where the maximum size $S_{max}$ does not exceed the size threshold value $S_{TH}$, the amplification factor A is further increased by one range (step S90). On the other hand, in a case where the maximum size $S_{max}$ exceeds the size threshold value $S_{TH}$, the signal processing circuit 118 returns to the process in step S20.

As described above, according to a series of processes illustrated in FIG. 9, when a size of the group of pixels which are too bright reaches a size of the object to be observed, it is possible to lower a range of the amplification factor A. For example, according to the series of processes illustrated in FIG. 9, the amplification factor A may be maintained at the highest value suitable for observation of the object to be observed. The higher the amplification factor A, the better noise resistance.

Figure 10:
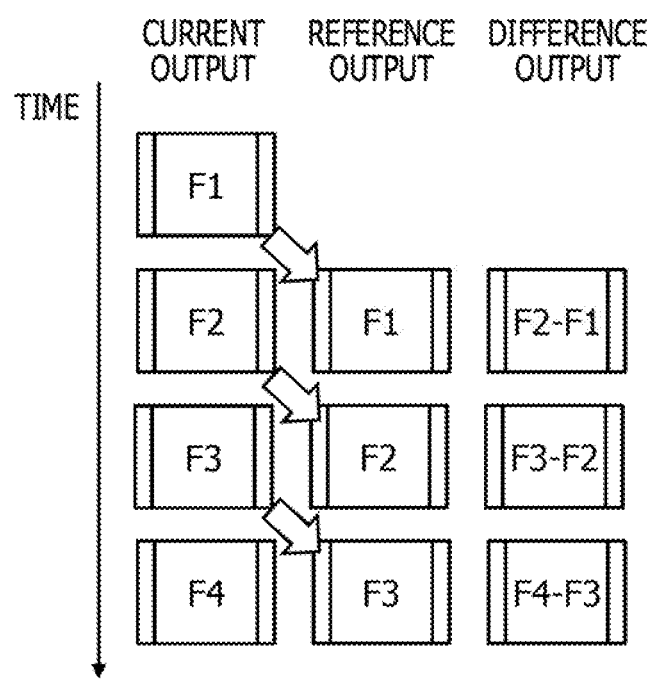
FIG. 10 is a diagram for explaining a first method of deriving a difference between two frames.
Figure 11:
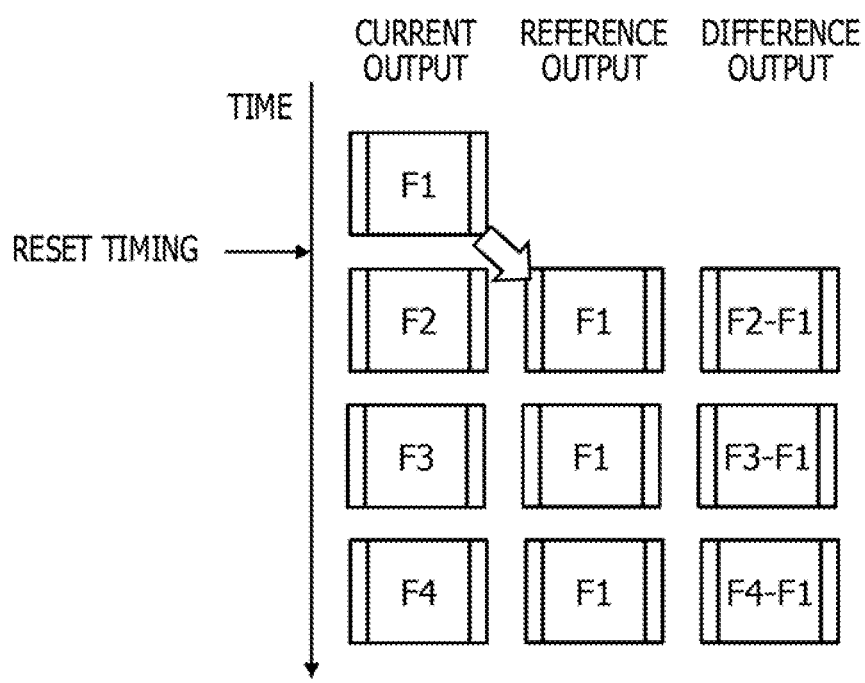
FIG. 11 is a diagram for explaining a second method of deriving a difference between two frames.

FIG. 10 is a diagram for explaining a first method of calculating a difference between signals generated in old and new two frames. FIG. 11 is a diagram for explaining a second method of calculating a difference between signals generated in old and new two frames. Each of F1 to F4 represents a frame. "Current output", "reference output", and "difference output" respectively represent an output of the first buffer 31a, an output of the second buffer 31b, and an output of the difference calculation circuit 83 (83A and 83B). The arrows illustrated in FIGS. 10 and 11 represent a timing at which the transfer gate 38 is turned on, that is, a timing at which a voltage of the integration capacitor 41 is transmitted to the holding capacitor 42.

FIG. 10 illustrates a case where the second signal held by the holding circuit 82 (82A and 82B) is updated for each frame. In an application for detecting a bright spot or the like, as illustrated in FIG. 10, calculating the difference between a current frame and a frame immediately before the current frame is effective in detecting the bright spot with high accuracy.

On the other hand, FIG. 11 illustrates a case where the second signal held by the holding circuit 82 (82A and 82B) is maintained without being updated even when moving to the next frame. In an application for detecting a minute change such as stress analysis or the like by thermal infrared rays, as illustrated in FIG. 11, it is effective to calculate a difference based on a predetermined frame (a frame F1 in FIG. 11) when detecting the minute change with high accuracy.

Figure 12:
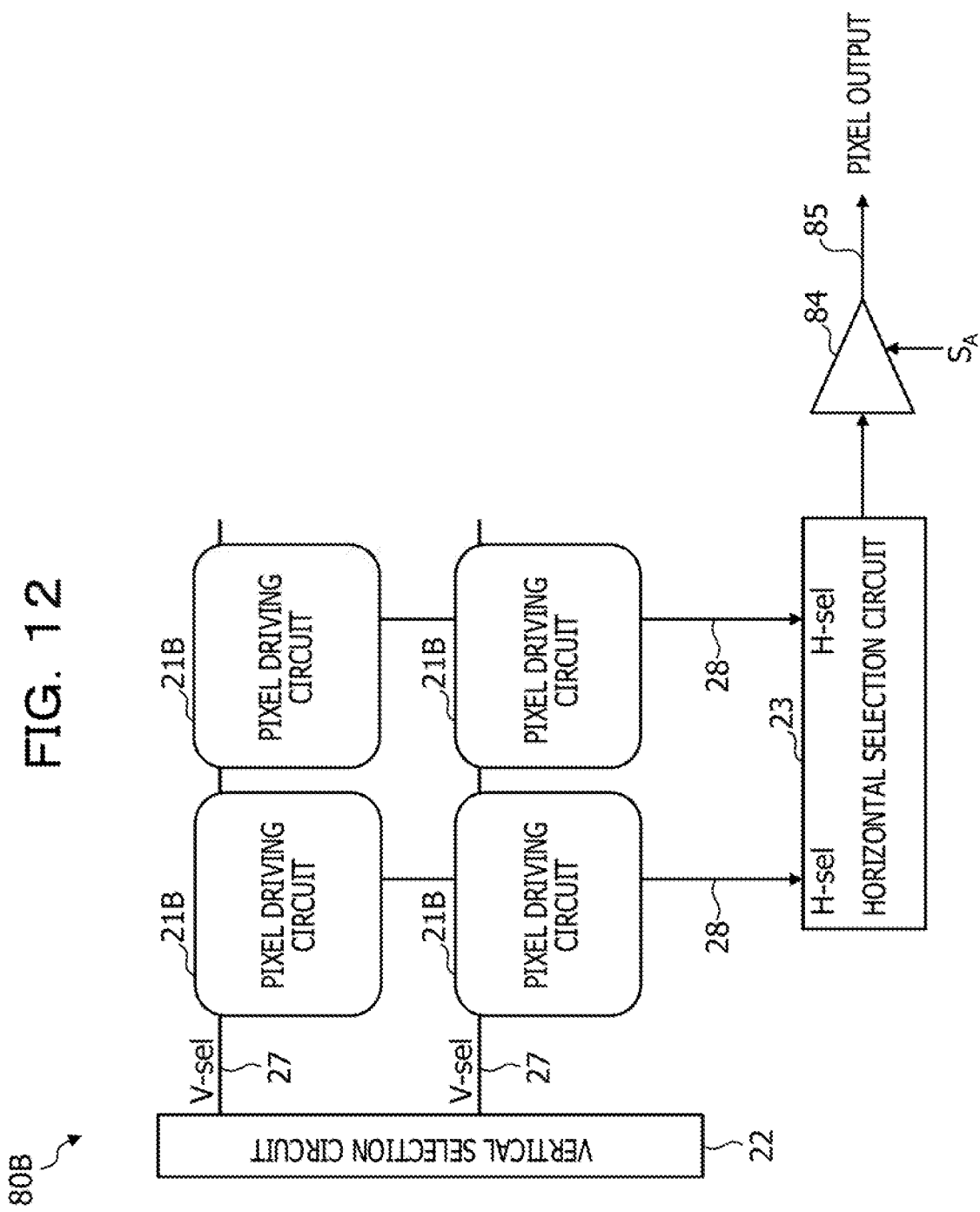
FIG. 12 is a diagram illustrating a second configuration example of a control circuit included in the imaging device according to the second embodiment.

FIG. 12 is a diagram illustrating a second configuration example of a control circuit included in the imaging device 114B according to the second embodiment. A control circuit 80B illustrated in FIG. 12 is an example of the control circuit 80 including the driving circuit 81 and the like described above. The driving circuit 81 in the control circuit 80B drives a corresponding infrared detector among the plurality of infrared detectors 24, and includes a plurality of pixel driving circuits 21B which generate, for each frame, a signal according to infrared rays incident on the corresponding infrared detector.

In the control circuit 80A illustrated in FIG. 6, the plurality of pixel driving circuits 21A share the difference calculation circuit 83A. In contrast, in the control circuit 80B illustrated in FIG. 12, although details will be described below, a difference calculation circuit 83B is provided in each of the plurality of pixel driving circuits 21B.

The control circuit 80B includes a plurality of scan lines 27 extending in parallel in a horizontal direction (a row direction), a plurality of vertical bus lines 28 extending in parallel in a vertical direction (a column direction), a vertical selection circuit 22, and a horizontal selection circuit 23.

The pixel driving circuits 21B are arranged in a matrix shape corresponding to respective intersections of the plurality of scan lines 27 and the plurality of vertical bus lines 28. The pixel driving circuit 21B is provided for a corresponding one of the plurality of infrared detectors 24. The plurality of pixel driving circuits 21B have configurations which are identical to one another.

Figure 13:
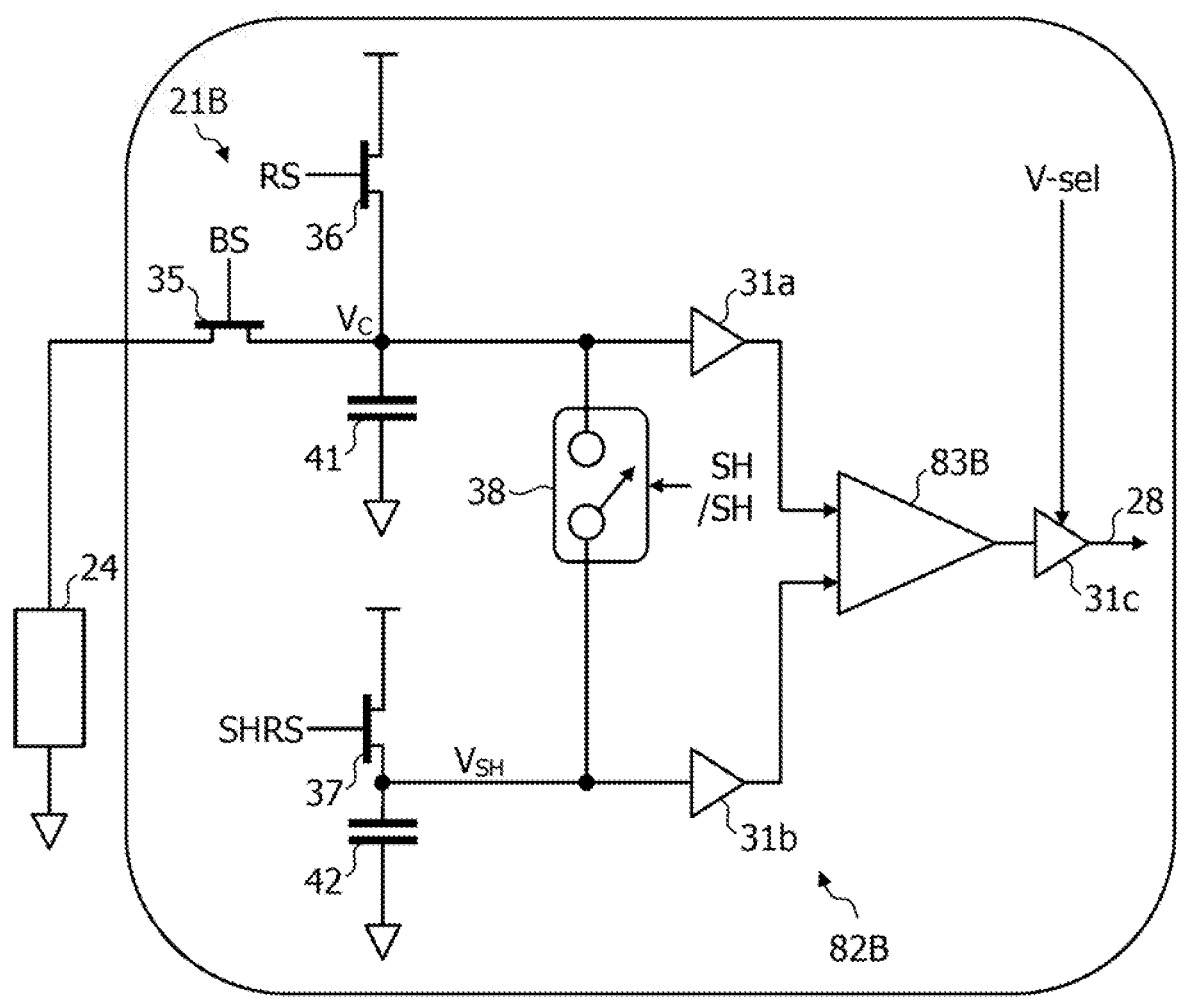
FIG. 13 is a diagram illustrating an example of a configuration of a pixel driving circuit and a holding circuit included in the control circuit according to the second configuration example.

FIG. 13 is a diagram illustrating an example of a configuration of the pixel driving circuit 21B and the holding circuit 82B included in the control circuit 80B according to the second configuration example. The description of configurations that are substantially the same as those of the first configuration example described above is omitted by incorporating the above description by reference. The pixel driving circuit 21B at least includes a driving transistor 35. The holding circuit 82B in the control circuit 80B includes the transfer gate 38, the integration capacitor 41, the holding capacitor 42, the first reset transistor 36, and the second reset transistor 37, in each of the plurality of pixel driving circuits 21B. The holding circuit 82B in the control circuit 80B includes the difference calculation circuit 83B, the first buffer 31a, the second buffer 31b, and a third buffer 31c in each of the plurality of pixel driving circuits 21B. The difference calculation circuit 83B is an example of the difference calculation circuit 83 described above. The holding circuit 82B is an example of the holding circuit 82 described above.

The first buffer 31a outputs the first signal corresponding to the first voltage $V_C$ to a first input unit of the difference calculation circuit 83B. The second buffer 31b outputs the second signal corresponding to the second voltage $V_{SH}$ to a second input unit of the difference calculation circuit 83B. According to the vertical selection signal V-sel, the third buffer 31c supplies a difference calculated by the difference calculation circuit 83B to the amplifier circuit 84 via the vertical bus line 28. For example, according to the vertical selection signal V-sel, the third buffer 31c is a transistor which switches whether or not to output the difference calculated by the difference calculation circuit 83B to the amplifier circuit 84 via the vertical bus line 28.

Next, an example of a sample hold operation performed by the pixel driving circuit 21B will be described with reference to FIGS. 8, 12, and 13. The description of configurations that are substantially the same as those of the operation of the pixel driving circuit 21A is omitted by incorporating the above description by reference.

The vertical selection circuit 22 sequentially outputs the vertical selection signal V-sel for selecting the plurality of scan lines 27 one by one. According to the vertical selection signal V-sel, the third buffer 31c, coupled to the scan line 27 to which the vertical selection signal V-sel is output, is selected. A differential voltage representing a difference calculated by the difference calculation circuit 83B coupled to an input unit of the selected third buffer 31c is output to each of the corresponding vertical bus lines 28 via the selected third buffer 31c.

The horizontal selection circuit 23 sequentially applies a read pulse H-sel. According to the read pulse H-sel, a voltage (a differential voltage) of the vertical bus line 28 is input to an input unit of the amplifier circuit 84. The differential voltage is an amplification factor set according to a setting signal $S_A$ of an amplification factor, and is output by the amplifier circuit 84.

The amplifier circuit 84 amplifies and outputs the difference calculated by the difference calculation circuit 83B. The amplifier circuit 84 is, for example, an output amplifier which amplifies the difference and outputs an amplified signal. The signal (the output signal of the amplifier circuit 84) output from the amplifier circuit 84 corresponds to an analog sensor output signal (a pixel output signal) output from the control circuit 80B. The pixel output signal is supplied to the sensor driving circuit 159 outside the imaging device 114 via the wiring 85.

Therefore, according to the control circuit 80B illustrated in FIGS. 12 and 13, a signal obtained by amplifying a difference between the first signal generated in the current first frame and the second signal generated in the past second frame is transmitted to the wiring 85 coupling between the imaging device 114 in a vacuum vessel and the external sensor driving circuit 159. Therefore, even when noise intrudes into the wiring 85, noise resistance is improved as compared with a configuration in which a minute signal is output as it is without amplifying the difference. As a result, for example, since noise resistance may be secured without using an expensive electromagnetic shielding material for the wiring 85 or without using an expensive cooler with little electromagnetic noise, miniaturization and cost reduction of the imaging device 114 may be achieved. According to miniaturization and cost reduction of the imaging device 114, miniaturization and cost reduction of an infrared imaging apparatus on which the imaging device 114 is mounted may be achieved. When using an electromagnetic shielding material for the wiring 85 or when using a cooler with little electromagnetic noise, noise resistance of the infrared imaging apparatus on which the imaging device 114 is mounted is further improved.

In the control circuit 80B illustrated in FIGS. 12 and 13, the difference calculation circuit 83B is provided in each of the plurality of pixel driving circuits 21B, and the plurality of pixel driving circuits 21B share the amplifier circuit 84. By providing the difference calculation circuit 83B in each of the plurality of pixel driving circuits 21B, a circuit area through which a minute signal which is easily affected by external noise passes is reduced (a minute difference is amplified in each pixel), so that noise resistance is improved.

Although a control circuit for infrared detectors, an imaging device, and a control method for the infrared detectors, the present disclosure is not limited to the above embodiments. Various modifications and improvements, such as combinations and substitutions with some or all of the other embodiments, are possible within the scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A control circuit for infrared detectors, comprising:
a driving circuit configured to drive a plurality of infrared detectors and generates, for each frame, a signal according to infrared rays incident on the plurality of infrared detectors;
a holding circuit configured to hold a first signal generated by the driving circuit in a first frame and a second signal generated by the driving circuit in a second frame before the first frame;
a difference calculation circuit configured to calculate a difference between the first signal and the second signal; and
an amplifier circuit configured to amplify and output the difference calculated by the difference calculation circuit,
the driving circuit includes a plurality of pixel driving circuits which drive a corresponding infrared detector among the plurality of infrared detectors, and generate, for each frame, a signal according to infrared rays incident on the corresponding infrared detector, and
the plurality of pixel driving circuits share the amplifier circuit.

2. The control circuit for infrared detectors according to claim 1, wherein the plurality of pixel driving circuits share the difference calculation circuit and the amplifier circuit.

3. The control circuit for infrared detectors according to claim 2,
wherein the holding circuit includes, in each of the plurality of pixel driving circuits,
a first capacitor which holds a first voltage according to infrared rays incident on the corresponding infrared detector among the plurality of infrared detectors in the first frame,
a first buffer which outputs the first signal corresponding to the first voltage according to a selection signal,
a second capacitor which holds a second voltage according to infrared rays incident on the corresponding infrared detector among the plurality of infrared detectors in the second frame, and
a second buffer which outputs the second signal corresponding to the second voltage according to the selection signal.

4. The control circuit for infrared detectors according to claim 1, wherein the difference calculation circuit is provided in each of the plurality of pixel driving circuits.

5. The control circuit for infrared detectors according to claim 4,
wherein the holding circuit includes, in each of the plurality of pixel driving circuits,
a first capacitor which holds a first voltage according to infrared rays incident on the corresponding infrared detector among the plurality of infrared detectors in the first frame,
a first buffer which outputs the first signal corresponding to the first voltage,
a second capacitor which holds a second voltage according to infrared rays incident on the corresponding infrared detector among the plurality of infrared detectors in the second frame,
a second buffer which outputs the second signal corresponding to the second voltage, and
a third buffer which supplies the difference calculated by the difference calculation circuit to the amplifier circuit according to a selection signal.

6. The control circuit for infrared detectors according to claim 1, wherein
the holding circuit includes, in each of the plurality of pixel driving circuits,
a first capacitor which holds a first voltage according to infrared rays incident on the corresponding infrared detector among the plurality of infrared detectors in the first frame,
a first buffer which outputs the first signal corresponding to the first voltage,
a second capacitor which holds a second voltage according to infrared rays incident on the corresponding infrared detector among the plurality of infrared detectors in the second frame,
a second buffer which outputs the second signal corresponding to the second voltage.

7. The control circuit for infrared detectors according to claim 1, wherein the second signal held by the holding circuit is updated for each frame.

8. The control circuit for infrared detectors according to claim 1, wherein the second signal held by the holding circuit is maintained without being updated even when moving to the next frame.

9. The control circuit for infrared detectors according to claim 1, wherein the amplifier circuit changes an amplification factor of the difference according to a setting signal from outside.

10. An imaging device comprising:
a plurality of infrared detectors;
a driving circuit configured to drive the plurality of infrared detectors and generates, for each frame, a signal according to infrared rays incident on the plurality of infrared detectors;
a holding circuit configured to hold a first signal generated by the driving circuit in a first frame and a second signal generated by the driving circuit in a second frame before the first frame;
a difference calculation circuit configured to calculate a difference between the first signal and the second signal; and
an amplifier circuit configured to amplify and output the difference calculated by the difference calculation circuit,
the driving circuit includes a plurality of pixel driving circuits which drive a corresponding infrared detector among the plurality of infrared detectors, and generate, for each frame, a signal according to infrared rays incident on the corresponding infrared detector, and
the plurality of pixel driving circuits share the amplifier circuit.

11. A control method for infrared detectors, comprising:
driving, by a driving circuit, a plurality of infrared detectors and generates, for each frame, a signal according to infrared rays incident on the plurality of infrared detectors;
holding, by a holding circuit, a first signal generated by the driving circuit in a first frame and a second signal generated by the driving circuit in a second frame before the first frame;
calculating, by a difference calculation circuit, a difference between the first signal and the second signal; and
amplifying and outputting, by an amplifier circuit, the difference calculated by the difference calculation circuit,
the driving circuit includes a plurality of pixel driving circuits which drive a corresponding infrared detector among the plurality of infrared detectors, and generate, for each frame, a signal according to infrared rays incident on the corresponding infrared detector, and the plurality of pixel driving circuits share the amplifier circuit.

\* \* \* \* \*